(12) United States Patent
Yasuda et al.

(10) Patent No.: US 9,263,670 B2
(45) Date of Patent: *Feb. 16, 2016

(54) MEMORY ELEMENT AND MEMORY DEVICE

(71) Applicant: Sony Corporation, Tokyo (JP)

(72) Inventors: Shuichiro Yasuda, Kanagawa (JP); Hiroaki Sei, Kanagawa (JP); Akira Kouchiyama, Kanagawa (JP); Masayuki Shimuta, Kanagawa (JP); Naomi Yamada, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 115 days.

This patent is subject to a terminal disclaimer.

(21) Appl. No.: 14/027,666

(22) Filed: Sep. 16, 2013

(65) Prior Publication Data

US 2014/0021434 A1    Jan. 23, 2014

Related U.S. Application Data

(63) Continuation of application No. 13/164,956, filed on Jun. 21, 2011, now Pat. No. 8,546,782.

(30) Foreign Application Priority Data

Jul. 7, 2010    (JP) .................................. 2010-155046

(51) Int. Cl.
*H01L 45/00*    (2006.01)
*H01L 27/24*    (2006.01)
*G11C 13/00*    (2006.01)

(52) U.S. Cl.
CPC .......... *H01L 45/085* (2013.01); *H01L 27/2436* (2013.01); *H01L 27/2472* (2013.01);

(Continued)

(58) Field of Classification Search
CPC ...................................................... H01L 45/085
USPC ........................ 257/3, 4, 5, E47.001, E21.622
See application file for complete search history.

(56) References Cited

U.S. PATENT DOCUMENTS 5,430,320  A  *  7/1995  Lee ................................ 257/412
7,838,861  B2 * 11/2010  Klostermann .................... 257/2

(Continued)

FOREIGN PATENT DOCUMENTS

CN            101047230         10/2007
CN            101765914          6/2010

(Continued)

OTHER PUBLICATIONS

Chinese Office Examination Report issued in connection with related Chinese Patent Application No. 201110184419.3 dated Oct. 28, 2014 with English translation.

(Continued)

*Primary Examiner* — Yu-Hsi D Sun
(74) *Attorney, Agent, or Firm* — Dentons US LLP

(57) ABSTRACT

A memory element and a memory device, the memory element including a first electrode, a memory layer, and a second electrode in this order. The memory layer includes a resistance change layer provided on the first electrode side, and an ion source layer provided on the second electrode side and is higher in resistance value than the resistance change layer. A resistance value of the resistance change layer is changeable in response to a composition change by applied voltage to the first and second electrodes.

8 Claims, 7 Drawing Sheets

(52) U.S. Cl.
CPC ........ *H01L45/1233* (2013.01); *H01L 45/1266* (2013.01); *H01L 45/141* (2013.01); *H01L 45/142* (2013.01); *H01L 45/143* (2013.01); *H01L 45/144* (2013.01); *G11C 13/0007* (2013.01)

(56) References Cited

U.S. PATENT DOCUMENTS

| | | | |
|---|---|---|---|
| 2006/0126423 A1* | 6/2006 | Aratani et al. | 365/232 |
| 2007/0012959 A1* | 1/2007 | Hachino et al. | 257/260 |
| 2009/0213647 A1* | 8/2009 | Choi et al. | 365/163 |

FOREIGN PATENT DOCUMENTS

| | | |
|---|---|---|
| JP | 2006-196537 | 7/2006 |
| JP | 2009-043757 | 2/2009 |

OTHER PUBLICATIONS

Rainer, Waser et al., Redox-Based Resistive Switching Memories-Nanoionic Mechanisms, Prospects, and Challenges; Advanced Materials; 2009; 21; pp. 2632-2663.

* cited by examiner

MEMORY ELEMENT AND MEMORY DEVICE

RELATED APPLICATION DATA

This application is a continuation of U.S. patent application Ser. No. 13/164,956 filed Jun. 21, 2011, the entirety of which is incorporated herein by reference to the extent permitted by law. The present application claims the benefit of priority to Japanese Patent Application No. JP 2010-155046 filed on Jul. 7, 2010 in the Japan Patent Office, the entirety of which is incorporated by reference herein to the extent permitted by law.

BACKGROUND

The present disclosure relates to a memory element storing information based on a change of electrical characteristics observed in a memory layer including an ion source layer and a resistance change layer, and to a memory device.

A semiconductor nonvolatile memory popularly used for data storage has been an NOR or an NAND flash memory. Such a semiconductor nonvolatile memory, however, has been pointed out that there are limitations on microfabrication considering the need for a high level of voltage for writing and erasing, and the limited number of electrons for injection to a floating gate.

For overcoming such limitations on microfabrication, a next-generation nonvolatile memory currently proposed is a resistance change memory such as ReRAM (Resistance Random Access Memory) or PRAM (Phase-Change Random Access Memory) (for example, see Japanese Unexamined Patent Application Publication No. 2006-196537, and Waser et. al, Advanced Materials, 21, p 2932 (2009). These memories are each in the simple configuration including a resistance change layer between two electrodes. In a memory of Japanese Unexamined Patent Application Publication No. 2009-43757, as an alternative to the resistance change layer, an ion source layer and an oxide film (thin film for storage) are provided between first and second electrodes. With the resistance change memories as such, it is understood that a resistance value changes by a conductive path formed as a result of the movement of atoms or ions by heat or an electric field.

SUMMARY

The resistance change memory as such includes two types, i.e., filament type and non-filament type. With the filament type, cations move by heat or an electric field, and a conductive path (filament) of a low resistance is formed, for example, and with the non-filament type, anions move. In the memory of the non-filament type, resistance change to be caused by current or voltage is gentle so that the resistance value is controlled with ease. However, there are still limitations on microfabrication due to the area dependence, i.e., the low-resistance region changes in resistance in accordance with the cell size. On the other hand, the memory of the filament type has no dependence on cell size because of the formation of a conductive path. This conductive path is made of metallic element, which is deposited by diffusion and reduction of cations on the interface between the electrode and the resistance change layer. As such, the memory of the filament type is expected to be used as a memory with no limitation on microfabrication.

The concern here is that the filament-type memory as such shows an abrupt change of resistance with a certain level of voltage. This thus results in disadvantages of poor controllability over resistance by applied voltage, and of a difficulty in achieving a stable operation.

It is thus desirable to provide a memory element and a memory device with improved controllability over resistance change by applied voltage.

A memory element according to an embodiment of the present disclosure includes a first electrode, a memory layer, and a second electrode in this order. The memory layer includes a resistance change layer provided on the first electrode side, and an ion source layer provided on the second electrode side. The ion source layer is higher in resistance value than the resistance change layer. A resistance value of the resistance change layer is changeable in response to a composition change by applied voltage to the first and second electrodes.

A memory device according to an embodiment of the present disclosure includes a plurality of memory elements each including a first electrode, a memory layer, and a second electrode in this order, and a pulse application unit applying a voltage or current pulse selectively to the memory elements. In the memory device, the memory elements are those according to the embodiment of the present disclosure.

With the memory element (memory device) according to the embodiment of the present disclosure, when a voltage or current pulse of "positive direction" (e.g., the first electrode side is at a negative potential, and the second electrode side is at a positive potential) with respect to the element in the initial state (high-resistance state), a metallic element contained in the ion source layer is ionized and diffused in the resistance change layer, and then is deposited by bonding to electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When a voltage pulse of "negative direction" (e.g., the first electrode side is at a positive potential, and the second electrode side is at a negative potential) is applied with respect to the element in the low-resistance state as such, the metallic element that has been deposited on the first electrode is ionized, and then is dissolved into the ion source layer. As a result, the conductive path made of the metallic element disappears, and the resistance change layer is increased in resistance (initial state or state of erasing).

Herein, by increasing the resistance value of the ion source layer to be higher than that of the resistance change layer, the formation speed for a conductive path is controlled when a voltage or current pulse is applied as described above. This accordingly makes gentle a change of resistance value of the resistance change layer.

With the memory element or the memory device according to the embodiment of the present disclosure, the ion source layer is higher in resistance value than that of the resistance change layer. This favorably controls the formation speed for the low-resistance section (conductive path) when a predetermined level of voltage or current pulse is applied via the first and second electrodes, thereby decreasing the speed of a change of resistance. As such, the controllability over the change of resistance is possibly improved in the resistance change layer by the applied voltage.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated

DETAILED DESCRIPTION OF THE PREFERRED EMBODIMENT

In the below, an embodiment of the present disclosure will be described in the following order by referring to the accompanying drawings.
[Embodiment]
1. Memory element (memory element whose memory layer is configured by an ion source layer and a resistance change layer)
2. Memory device
[Modification]
(memory element including an oxide layer as a memory layer between a resistance change layer and a first electrode)

EXAMPLES (Embodiment)
(Memory Element)

Figure 1:
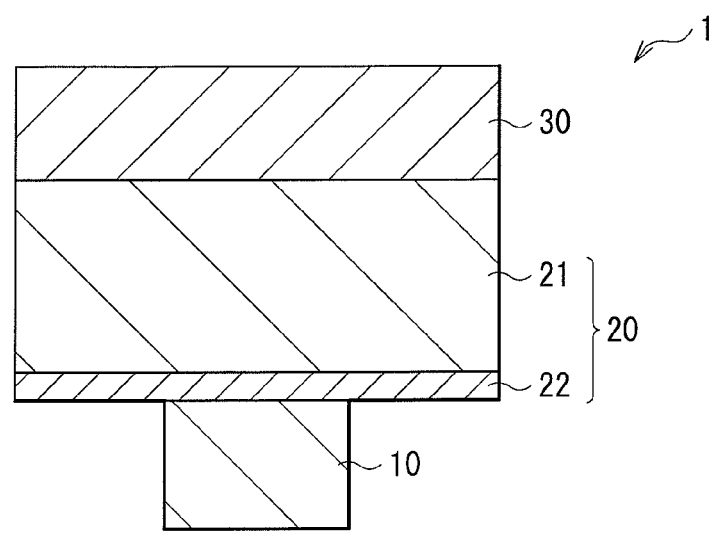
FIG. 1 is a cross-sectional view of a memory element in an embodiment of the present disclosure, showing the configuration thereof.

FIG. 1 is a cross-sectional view of a memory element 1 in an embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. The lower electrode 10 is made of a material for wiring used in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the lower electrode 10 made of Cu or others as such may be covered on the surface with a material that hardly causes ion conduction or thermal diffusion, e.g., W, WN, titanium nitride (TiN), and tantalum nitride (TaN). When the ion source layer 21 that will be described later contains Al, preferably used is a metal film containing at least one of chromium (Cr), W, cobalt (Co), silicon (Si), gold (Au), palladium (Pd), Mo, iridium (Ir), titanium (Ti), and others that are more resistant to ionization than Al, or an oxide or nitride film thereof.

The memory layer 20 includes the ion source layer 21, and a resistance change layer 22. The ion source layer 21 contains an element to be converted into movable ions (cations and anions) that diffuse to the resistance change layer 22. The element that may be cationized includes one or two or more of metallic elements such as Cu, Al, germanium (Ge), and zinc (Zn). As an ion conductive material that is to be anionized includes at least one or more of chalcogen elements including oxygen (O) or tellurium (Te), sulfur (S) and selenium (Se), for example. The ion source layer 21 is disposed on the upper electrode 30 side, and in this example, is in contact with the upper electrode 30. The metallic element(s) and the chalcogen element(s) are bonded together, thereby forming a metal chalcogenide layer. This metal chalcogenide layer is mainly in the amorphous structure, and serves as an ion supply source. In the memory element 1 in the embodiment, the ion source layer 21 has a resistance value higher than that of the resistance change layer 22 in the initial or erasing state.

As for the metallic element that may be cationized, as is reduced on the cathode electrode during the operation of writing and forms a conductive path (filament) in the form of metal, any element chemically stable is preferable, i.e., remain in the form of metal in the ion source layer 21 containing the chalcogen element(s) described above. Such a metallic element includes, other than those described above, transition metals of groups 4A, 5A, and 6A in the periodic table, i.e., Ti, zirconium (Zr), hafnium (Hf), vanadium (V), niobium (Nb), Ta, Cr, Mo, and W, for example. Among these elements, one or two or more may be used. Alternatively, silver (Ag) and Si may be used as additive elements to the ion source layer 21, for example. Herein, the ion source layer 21 is preferably with a high content of chalcogen element such as Te, or Ge or Si to have a resistance value higher than that of the resistance change layer 22 that will be described later.

Moreover, using any metallic element (M) that is more likely to react with Te contained in the resistance change layer 22 that will be described later, the ion source layer 21 may be in the layered structure of Te/ion source layer (containing the metallic element M). If this is the configuration, with a heat treatment after the film formation, the resulting structure is stabilized as MTe/ion source layer 21. The material more likely to react with Te is exemplified by Al, magnesium (Mg), and others.

The specific material of the ion source layer 21 as such includes ZrTeAl, TiTeAl, CrTeAl, WTeAl, TaTeAl, and others. Such specific materials may also include CuZrTeAl being a result of addition of Cu to ZrTeAl, CuZrTeAlGe being a result of addition of Ge to CuZrTeAl, and CuZrTeAlSiGe being a result of addition of another additive element to CuZrTeAlGe. Another option is ZrTeMg including Mg as an alternative to Al. As for the ionizing metallic element, any similar additive element may be used even if a transition metal element selected for use is not Zr but Ti or Ta, e.g., TaTeAlGe. Moreover, as for the ion conductive material, Te is surely not restrictive, and sulfur (S), selenium (Se), or iodine (I) may be also used, i.e., specifically ZrSAl, ZrSeAl, ZaIAl, CuGeTeAl, and others. Furthermore, Al is not necessarily included, and CuGeTeZr or others may be also used.

Note that the ion source layer 21 may be added with any other elements for the purpose of preventing peeling of film during a high-temperature heat treatment for the memory layer 20, for example. Silicon (Si) is an exemplary additive element that offers also the improvement of retention characteristics, and is preferably added to the ion source layer 21 together with Zr. Herein, if the content of Si for addition is not enough, the effect of preventing the film peeling is not sufficiently produced, and if the content thereof is too much, the resulting memory operation characteristics are not satisfactory enough. In consideration thereof, the content of Si in the ion source layer 21 is preferably in the range of about 10 to 45 atomic %.

The resistance change layer 22 is positioned on the lower electrode 10 side, and in this example, is in contact with the lower electrode 10. This resistance change layer 22 serves as a barrier against electric conduction. Moreover, compared with the ion source layer 21, the resistance change layer 22 is lower in resistance value, and when a predetermined level of voltage is applied between the lower and upper electrodes 10 and 30, the resistance value thereof shows a change. In this embodiment, this resistance change layer 22 is made of a compound mainly containing Te, which behaves as anionic components. The compound as such includes AlTe, MgTe, ZnTe, and others. As for the composition of the compound containing Te as such, preferably, in AlTe, for example, the content of Al is preferably in the range from 20 to 60 atomic % both inclusive due to the reasons that will be described later. Moreover, the resistance change layer 22 preferably has the initial resistance value of 1 MΩ or larger. Considering as such, the resistance value in the state of low resistance is preferably several hundred kΩ or smaller. For reading at a high speed the state of resistance of any microfabricated resistance change memory, the resistance value in the state of low resistance is preferably as low as possible. However, because the resistance value is 40 to 100 kΩ when writing is performed with the conditions of 20 to 50 μA and 2 V, the memory is supposed to have the initial resistance value higher than that value. Allowing for the one-digit width of resistance separation, the resistance value described above is considered appropriate. Note here that the resistance change layer 22 may be made not only of the above-described material containing Te but also of any previously-used oxide such as GaOx and AlOx.

The upper electrode 30 may be made of a material similar to that of the lower electrode 10, i.e., a well-known material for use of semiconductor wiring, and preferably, be made of a stable material not reacting with the ion source layer 21 even after post-annealing.

In such a memory element 1 of the embodiment, when a voltage pulse or current pulse is applied by a power supply circuit (pulse application unit; not shown) via the lower and upper electrodes 10 and 30, the memory layer 20 shows a change of the electrical characteristics, e.g., change of resistance value, thereby performing information writing, erasing, and reading. In the below, such an operation will be described specifically.

First of all, a positive voltage is applied to the memory element 1 such that the upper electrode 30 is at a positive potential, and the lower electrode 10 side is at a negative potential, for example. In response thereto, the metallic element contained in the ion source layer 21 is ionized and diffused to the resistance change layer 22, and then is deposited by bonding to electrons on the lower electrode 10 side. As a result, a conductive path (filament) is formed on the interface between the lower electrode 10 and the memory layer 20. This conductive path is made of a low-resistance metallic element reduced in the form of metal. Alternatively, the ionized metallic element remains in the resistance change layer 22, and forms an impurity level. This accordingly forms a conductive path in the resistance change layer 22 so that the resistance value of the memory layer 20 is decreased, i.e., the memory layer 20 shows a decrease of resistance value to be lower (to be in the low-resistance state) than that in the initial state (in the high-resistance state).

Thereafter, even if the memory element 1 becomes free of voltage by removing the positive voltage, the low resistance state is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the upper electrode 30 is at a negative potential, and the lower electrode 10 side is at a positive potential, for example. In response thereto, in the conductive path formed inside of the memory layer 20, the metallic element is ionized, and then is dissolved into the ion source layer 21 or is bonded to Te or others, thereby forming a compound such as $Cu_2Te$ or $CuTe$. As a result, the conductive path made of the metallic element disappears or is decreased, and the resistance value thus shows an increase.

Thereafter, even if the memory element 1 becomes free of voltage by removing of the negative voltage, the resistance value therein remains high. This allows erasing of written information. By repeating such a procedure, the memory element 1 is to be subjected to repeated writing of information and erasing of the written information.

If the state high in resistance value is related to information of "0", and if the state low in resistance value is related to information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is related to the writing operation and the operation of increasing the resistance thereof is related to the erasing operation, the relation may be inversed.

For demodulation of recorded data, the larger ratio is more preferable between an initial resistance value and an after-recording resistance value. However, too large resistance value of the resistance change layer 22 causes a difficulty in writing, i.e., in decreasing the resistance. As a result, because a threshold voltage for writing is increased too much, the initial resistance value is adjusted to be 1 GΩ or smaller. The resistance value of the resistance change layer 22 is controllable by the thickness thereof or the content of anions therein, for example.

In this embodiment, the resistance change layer 22 is made of a compound whose main content is Te. Therefore, during the decrease of resistance thereof, the metallic element diffused from the ion source layer 21 is stabilized in the resistance change layer 22 so that the resulting low-resistance state becomes easy to retain. Moreover, compared with oxides high in electronegativity and silicon compounds being covalent compounds, the binding force of Te with the metallic element is weaker, and thus the metallic element diffused inside of the resistance change layer 22 is easily moved to the ion source layer 21 by the application of an erasing voltage so that the erasing characteristics are improved. Note that, as for the electronegativity of the chalcogenide compounds, because the absolute values of the chalcogen elements are in the ascending order of tellurium<selenium<sulfur<oxygen, the effect of improvement is to be high with the lower content of oxygen in the resistance change layer 22, and with the use of a chalcogenide compound low in electronegativity.

Moreover, in the embodiment, as described above, the ion source layer 21 preferably contains Ze, Al, Ge, and others. In the below, the reasons will bedescribed.

When the ion source layer 21 contains Zr, Zr acts as an ionizing element together with the metallic element such as copper (Cu) described above so that the resulting conductive path is a mixture of Zr and the above-described metallic element such as Cu. Herein, Zr seems to be reduced on the cathode electrode during the operation of writing, and seems to form a filament in the form of metal in the low-resistance state after the writing. The metal filament as a result of reduction of Zr is relatively difficult to dissolve in the ion source layer 21 containing the chalcogenide element(s) such as S, Se, and Te. Therefore, once the state is put in writing, i.e., in the low-resistance state, the resulting low-resistance state is retained more easily than in the case with a conductive path containing only the above-described metallic element such as Cu. For example, Cu is formed as a metal filament by the operation of writing. However, Cu in the form of metal is dissolved easily in the ion source layer 21 containing the chalcogenide element(s), and in the state of no application of a voltage pulse for writing, i.e., in the state of data retention, Cu is ionized again and the state is changed to high resistance. The resulting characteristics of data retention are not thus satisfactory. On the other hand, combining Zr with appropriate content of Cu facilitates amorphization, and keeps the microstructure of the ion source layer 21 uniform, thereby contributing to the improvement of the characteristics of resistance value retention.

Moreover, for retention of the high-resistance state during erasing, when the ion source layer 21 contains Zr, a conductive path to be formed includes Zr, for example, and when Zr is dissolved in the ion source layer 21 again as ions, due to the lower ion mobility of Zr at least than Cu, the Zr ions are resistant to move even if the temperature is increased, or even if they are left as they are for a long time. As such, Zr in the form of metal is not easily deposited on the cathode electrode, and thus remains high in resistance even if it is kept in the temperature higher than the room temperature or if it is left as it is for a long time.

Moreover, when the ion source layer 21 contains Al, if the upper electrode is biased to a negative potential as a result of the erasing operation, the high-resistance state (erasing state) is stabilized by forming an oxide film stable on the interface between the ion source layer 21 behaving like a solid-electrolyte and the anode electrode. This also contributes to the increase of repetition frequency in terms of the self-reproduction of the resistance change layer. Herein, Al is surely not the only option, and Ge or others acting similar thereto may be also used.

As such, when the ion source layer 21 contains Zr, Al, Ge, and others, compared with the existing memory element, the resulting memory element has the improved characteristics of wide-range resistance value retention and of high-speed operation of writing and erasing, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state may be created also through adjustment of the amount of atoms for deposition by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Zr, Cu, and Al, and also Ge.

If the content of Zr is too much, for example, the resulting ion source layer 21 is decreased too much in resistance value, thereby failing in voltage application effectively to the ion source layer 21, or resulting in a difficulty in dissolving Zr in the chalcogenide layer. This especially causes a difficulty in erasing, and the threshold voltage for erasing is increased based on the addition content of Zr. If the content of Zr is too much, this results in a difficulty also in writing, i.e., decrease of resistance. On the other hand, if the addition content of Zr is too little, the effect of improving the characteristics of wide-range resistance value retention as described above is impaired. In consideration thereof, the content of Zr in the ion source layer 21 is preferably 7.5 atomic % or more, and more preferably, 26 atomic % or less.

Moreover, although adding an appropriate content of Cu to the ion source layer 21 indeed facilitates amorphization, if the content thereof is too much, Cu in the form of metal degrades the characteristics of writing retention or adversely affects the speed of the writing operation as is not stable enough in the ion source layer 21 containing the chalcogen element(s). Whereas a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer is enough in the above-described range, the conductive path of metal zirconium (Zr) is supposed to remain as it is even if the conductive path made of Cu is dissolved again into the ion source layer 21, and thus the characteristics of writing retention are not affected. Moreover, as for the preferable addition content of Cu, probably, as long as cations and anions being the results of dissociation and ionization are in the equivalent relationship of the amount of charge, the equivalence ratio of the charge of ions is supposed to fall within a range of {(Highest Valence of Zr Ions× Number of Moles or Atomic %)+(Valence of Cu Ions×Number of Moles or Atomic %)}/(Valence of Chalcogen Ions× Number of Moles or Atomic %)=0.5 to 1.5.

Note here that, virtually, the characteristics of the memory element 1 are dependent on the composition ratio between Zr and Te. Accordingly, the composition ratio between Zr and Te preferably falls within the following range.

Composition Ratio of Zr(Atomic %)/Composition Ratio of Te(Atomic %)=0.2 to 0.74

This is not surely evident, but because Cu has the degree of dissociation lower than that of Zr, and because the resistance value of the ion source layer 21 is determined by the composition ratio between Zr and Te, as long as the composition ratio between Zr and Te falls within the above-described range, the resistance value is suitable. This thus is thought that because the bias voltage applied to the memory element 1 applied effectively to the portion of the resistance change layer 22.

When the value does not fall within the range described above, e.g., when the equivalence ratio is too large, the balance between the cations and anions is lost, and thus among the existing metallic elements, an element not ionizing is increased in amount. Therefore, the conductive path generated by the operation of writing during the operation of erasing may not be eliminated efficiently. Similarly, when the anion element exists too much because the equivalence ratio is too small, the conductive path in the form of metal generated by the operation of writing is difficult to remain in the form of metal. The characteristics of writing state retention thus seem to be degraded.

When the content of Al is too much, the Al ions become easy to move, thereby creating the state of writing by reduction of the Al ions. Because Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention is impaired, thereby decreasing the repetition frequency. In consideration thereof, the content of Al in the ion source layer 21 is preferably 30 atomic % or more, and more preferably, 50 atomic % or less.

Herein, Ge is not necessarily contained, but when Ge is to be added, the content thereof is preferably 15 atomic % or less considering that too much content of Ge degrades the characteristics of writing retention.

In the below, the manufacturing method of the memory element 1 in the embodiment will be described.

First of all, on a substrate formed with a CMOS circuit such as selection transistor, the lower electrode 10 made of TiN or others is formed. Thereafter, if necessary, oxides or others on the surface of the lower electrode 10 are removed by reverse sputtering, for example. Next, the formation of layers is performed up to the upper electrode 30 including the resistance change layer 22 and the ion source layer 21 in succession through exchange of targets in a device for sputtering. The targets herein are those each with the composition adapted for the material of the corresponding layer. The diameter of the electrode is 50 to 300 nm$\phi$. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed.

In this memory element 1, as described above, a voltage is so applied that the upper electrode 30 is at a positive potential and the lower electrode 10 is at a negative potential, thereby forming a conductive path on the interface between the lower electrode 10 and the resistance change layer 22. This accordingly decreases the resistance value of the resistance change layer 22 so that writing is performed. Next, to each of the upper and lower electrodes 30 and 10, applied this time is a voltage whose polarity is opposite to that applied thereto for writing. In response thereto, the metallic element in the conductive path formed inside of the resistance change layer 22 is ionized again, and then is dissolved into the ion source layer 21. This accordingly increases the resistance value of the resistance change layer 22 so that erasing is performed.

Figure 9:
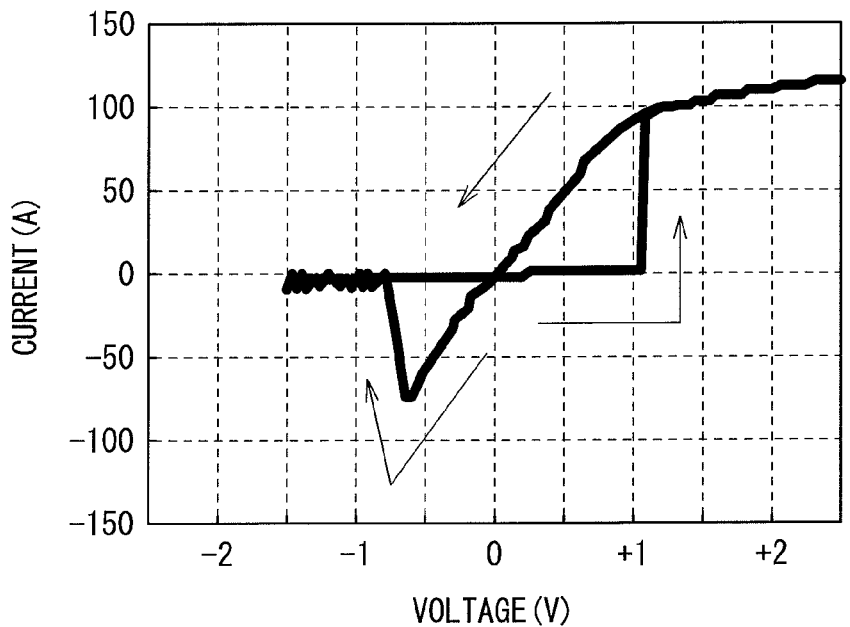
FIG. 9 is a diagram showing the current-voltage characteristics in an example of related art.

FIG. 9 is a diagram showing the current-voltage characteristics of a memory element of related art in which the resistance change layer 22 has a resistance value higher than that of the ion source layer 21 at the time of application of an operating voltage. In this memory element, the lower electrode is made of W, the resistance change layer is made of GdOx, the ion source layer is made of CuTe-Based, and the upper electrode is made of Zr. This memory element is of a filament type, forming a conductive path by the movement of cations (Cu in this example) toward the lower electrode side. As for the resistance change of such a memory element, the current shows an abrupt increase/decrease at a certain level of voltage (+1 V and −0.5 V in this example), i.e., increase/decrease of resistance. With such a memory element, controlling the resistance of the resistance change layer by applied voltage is difficult, and there thus is a disadvantage in achieving a stable operation.

Figure 7A:
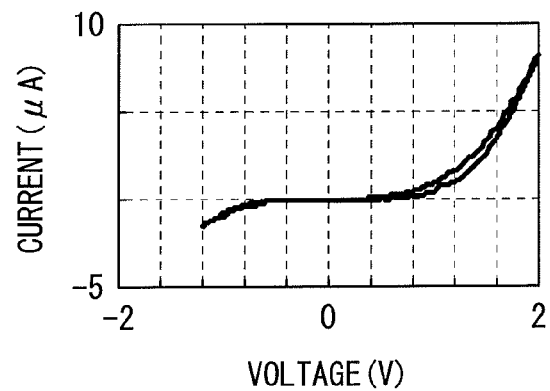
FIGS. 7A and 7B are each a diagram also showing the current-voltage characteristics in Examples and Comparative Example.

On the other hand, the memory element 1 in the embodiment shows a resistance change gentle like a non-filament type as described above because the ion source layer 21 therein has a resistance value higher than that of the resistance change layer 22. That is, the resistance change layer 22 is prevented from abruptly changing in resistance value, and as shown in Examples that will be described later (refer to FIG. 7, for example), a change of resistance value by applied voltage becomes gentle.

Such a change of conduction pattern due to a difference of resistance value as above is explainable by application of the debate on reaction control and diffusion control in the electrochemical reaction. First of all, the reaction control denotes the state in which the rate of electrochemical reaction is slower than the supply rate of a reactive substance by diffusion, and the rate of reaction in its entirety is almost equal to the rate of electrochemical reaction. The diffusion control denotes the state in which the rate of electrochemical reaction is faster than the supply rate of a reactive substance by diffusion, and the rate of reaction in its entirety is determined by the diffusion control. The memory element of a filament type is supposed to show a resistance change of diffusion control, and the memory element of a non-filament type is supposed to show a resistance change of reaction control.

In a memory element including a resistance-changing memory layer between lower and upper electrodes, a region where an electrochemical reaction occurs is located in the vicinity of the lower electrode. When the memory element is of a filament type of related art in which an ion source layer is higher in resistance than a resistance change layer, a voltage is mainly directed to the resistance change layer where the resistance is high. When a voltage is mainly directed to the region in the vicinity of the lower electrode as such, the voltage is used almost entirely for an electrochemical reaction. This thus causes a shortage of voltage for diffusing an ionic conductor into the solid electrolyte, thereby resulting in diffusion control. With the diffusion control as such, an electrochemical reaction occurs at an instance when the movable ions come closer to the region in the vicinity of the lower electrode. This thus causes deposition of the ions or an intercalation reaction so that the ions enter the resistance change layer. As a result, the reaction occurs mainly at the most reactive portion, i.e., the lower electrode. As such, the rate of reaction is difficult to control, and thus such an instantaneous resistance change as shown in FIG. 9 is observed.

On the other hand, with the memory element 1 in the embodiment in which the ion source layer 21 has the resistance higher than that of the resistance change layer 22, a region where a chemical reaction occurs is located in the vicinity of the lower electrode similarly to the memory element of a filament type. However, a voltage is not mainly directed to the region in the vicinity of the lower electrode 10 because the ion source layer 21 is higher in resistance than the resistance change layer 22. As such, the voltage is applied almost entirely to the ion source layer 21, and this facilitates the movement of the movable ions to the lower electrode 10 side. Whereas because the voltage applied to the resistance change layer 22 is low, and because an electrochemical reaction in the vicinity of the lower electrode 10 proceeds slowly, the electrochemical reaction proceeds in the entire of the lower electrode 10. As such, the memory element 1 shows a resistance change gentle like a non-filament type.

As described above, with the memory element 1 in the embodiment, the rate of resistance change in the resistance change layer 22 is allowed to be decreased because the ion source layer 21 is increased in resistance value to be higher than that of the resistance change layer 22. That is, this may lead to the improvement of controllability over the resistance change in the resistance change layer 22 by applied voltage. This also allows multilevel storage. Herein, the phenomenon referred to as the filament type and the non-filament type is controllable successively through the control of a resistance value ratio of each layer. That is, the diameter of the filament becomes also controllable thereby. In the embodiment, although exemplified is the memory element 1 in which movable ions are cations, this is surely not restrictive, and the memory element 1 is applicable to an ReRAM using anions as well.

Moreover, because the ion source layer 21 contains Zr, Al, Ge, and others, the characteristics of data retention thereof are excellent. Even if the transistor is decreased in current drive force as a result of microfabrication, information retention is possible. As such, by using this memory element 1, the resulting memory device is favorably high in density and small in size.

(Memory Device)

By arranging a plurality of memory elements 1 described above in rows or in a matrix, for example, a memory device (memory) is possibly configured. At this time, as necessary, the memory elements 1 may be each connected with a MOS transistor for element selection use or with a diode to configure a memory cell. The resulting memory cells may be then each connected to a sense amplifier, an address decoder, circuits of writing, erasing, and reading, and others by wiring.

Figure 2:
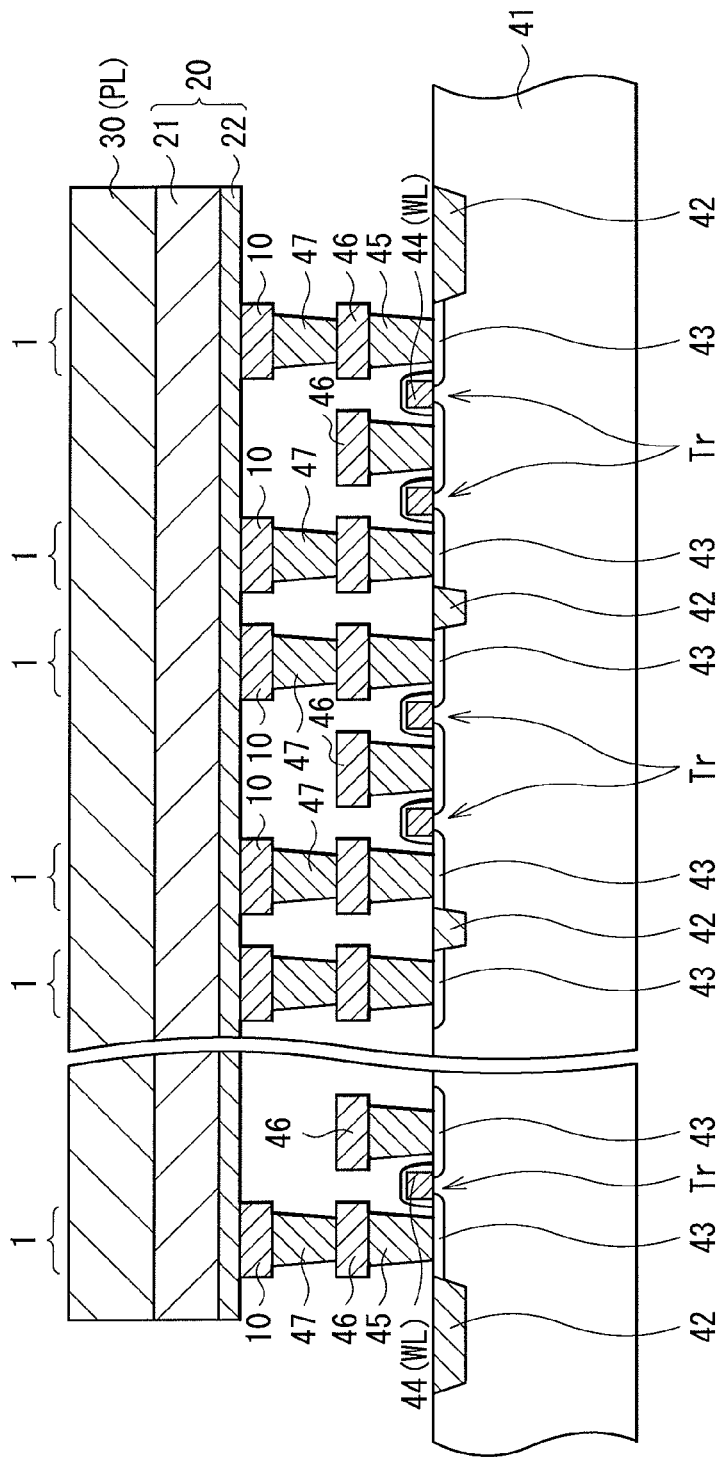
FIG. 2 is a cross-sectional view of a memory cell array using the memory element of FIG. 1, showing the configuration thereof.
Figure 3:
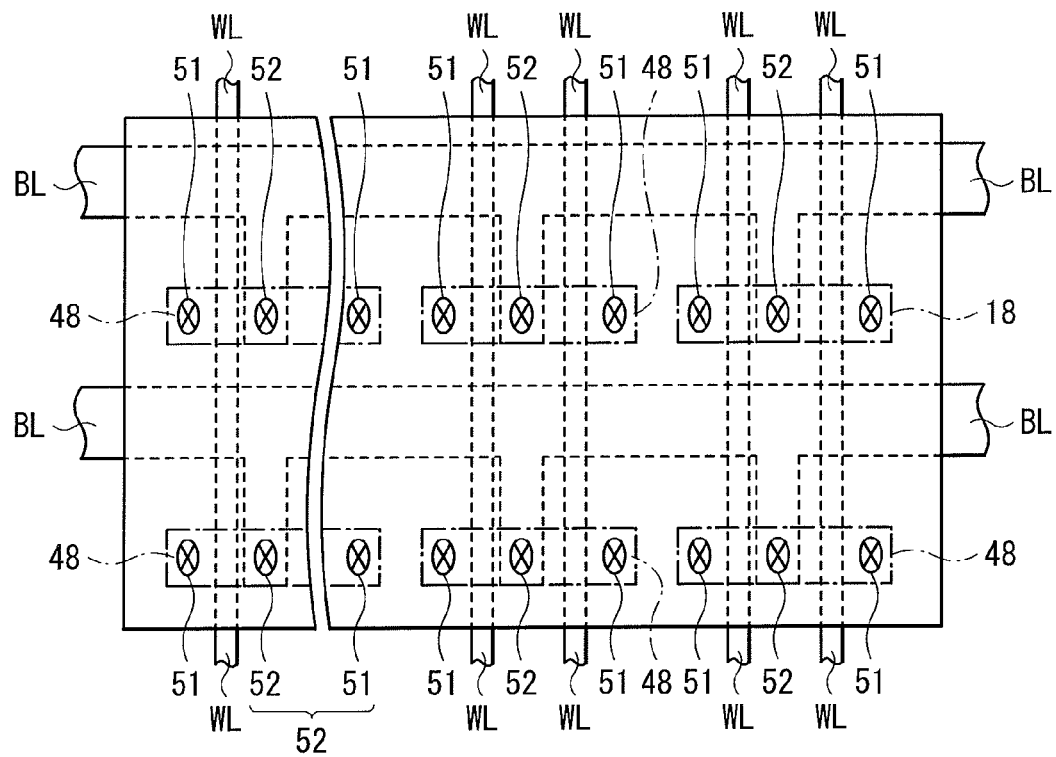
FIG. 3 is a plan view of the memory cell array of FIG. 2.

FIGS. 2 and 3 each show an exemplary memory device (memory cell array) including a plurality of memory elements 1 arranged in a matrix. FIG. 2 shows the cross-sectional configuration of the memory cell array, and FIG. 3 shows the configuration thereof in a planar view. In this memory cell array, to each of the memory elements 1, wiring for connection to the lower electrode 10 side thereof is so provided as to intersect with wiring for connection to the upper electrode 30 side thereof, and at the respective intersection points, the memory element 1 is disposed.

The memory elements 1 all share the layers, i.e., the resistance change layer 22, the ion source layer 21, and the upper electrode 30. That is, these layers, i.e., the resistance change layer 22, the ion source layer 21, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another between adjacent cells. As such, the memory elements 1 in the memory cells are each defined by position to correspond to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. The gate electrode 44 is formed, on the wall surface, with a side wall insulation layer. The gate electrode 44 serves also as a word line WL, which is one of two pieces of address wiring for the memory element 1. One of the source/drain regions 43 of the MOS transistor Tr is electrically connected to the lower electrode 10 of the memory element 1 with a plug layer 45, a metal wiring layer 46, and a plug layer 47 in between. The other of the source/drain regions 43 of the MOS transistor Tr is connected to the metal wiring layer 46 with the plug layer 45 in between. The metal wiring layer 46 is connected to a bit line BL (refer to FIG. 3), which is the other piece of address wiring for the memory element 1. Note that, in FIG. 3, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array, when a voltage is applied to the bit lines BL with the gate of the MOS transistor Tr turned ON by the word line WL, the voltage is applied to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current for application to the selected memory cell is set to be smaller than the threshold value of the voltage or others at which the memory element 1 shows a change of resistance value.

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.

(Modification)

Figure 4:
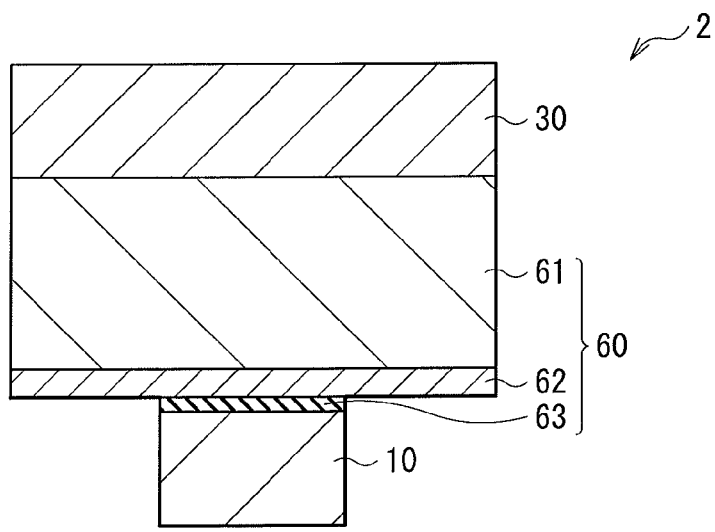
FIG. 4 is a cross-sectional view of a memory element in a modification of the present disclosure, showing the configuration thereof.

Next, described is a memory element 2 in a modification of the embodiment described above. FIG. 4 is a cross-sectional view of the memory element 2, showing the configuration thereof. Note that, in the following description of the memory element 2, any component similar to that in the embodiment described above is provided with the same reference numeral, and is not described again. This memory element 2 is configured to include the lower electrode 10 (first electrode), a memory layer 60, and the upper electrode 30 (second electrode) in this order.

The memory layer 60 includes an ion source layer 61, a resistance change layer 62, and an oxide layer 63. The ion source layer 61 has the composition similar to that of the ion source layer 21 described above. The oxide layer 63 is formed by oxidizing the lower electrode 10 by plasma oxidation, for example.

In the memory element 2 in this modification, the oxide layer 63 is provided between the resistance change layer 62 and the lower electrode 10. This favorably leads to the effect of protecting the lower electrode from anodic oxidation in addition to the effect achieved in the embodiment described above.

EXAMPLES

In the below, specific examples of the present disclosure will be described.

Examples 1 to 4, and Comparative Example 1

Similarly to the embodiment described above, the memory elements 1 and 2 of FIGS. 1 and 4 were each manufactured.

Figure 5:
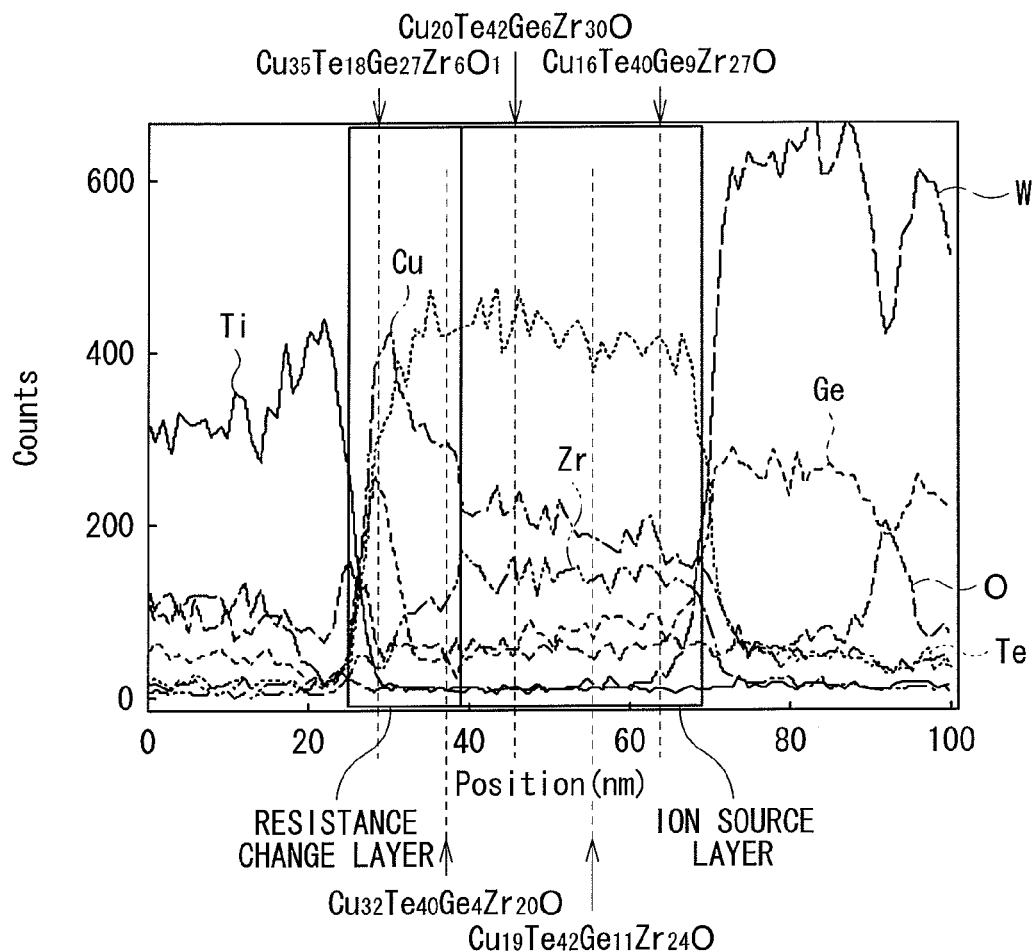
FIG. 5 is a TEM image showing the layer composition of Example 1.
Figure 6A:
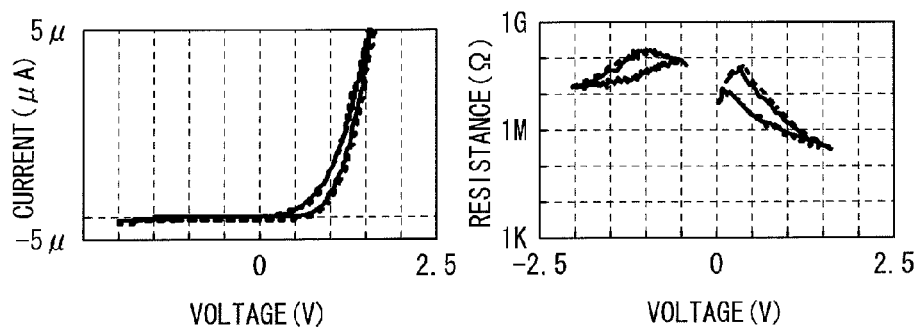
FIGS. 6A to 6C are each a diagram showing the current-voltage characteristics of Examples.
Figure 6B:
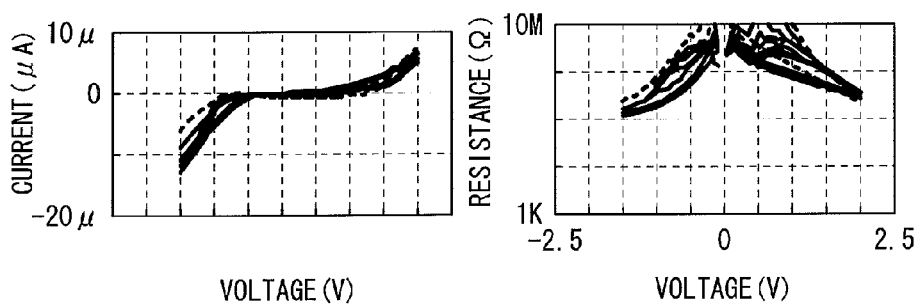
Figure 6C:
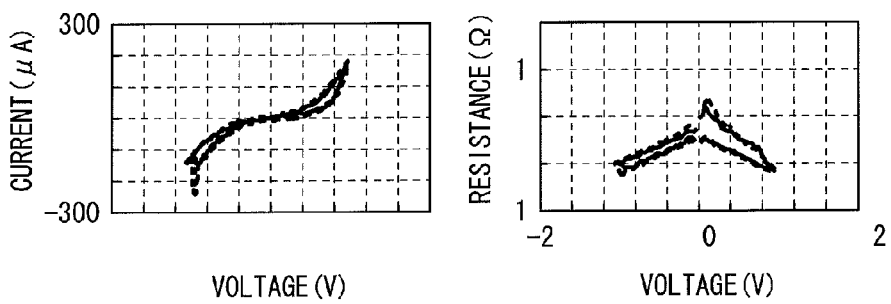

First of all, the lower electrode 10 made of TiN was formed and then was subjected to plasma oxidation. The resulting lower electrode 10 was then formed thereon with the memory layer 20 or 60, and the upper electrode 30 using a sputtering device. The diameter of the electrode was set to 50 to 300 nm$\phi$. A film made of alloy was formed at the same time using a target of a component element. Thereafter, the surface of the upper electrode 30 was subjected to etching, thereby forming a wiring layer (Al layer) with the thickness of 200 nm for a connection to a contact portion, which was formed for the external circuit connection use for provision of an intermediate potential (Vdd/2). After the film formation as such, as a post-annealing process, the resulting structure was subjected to a heat treatment in a vacuum heat treatment furnace for two hours under the temperature of 200° C. As such, the memory cell arrays of FIGS. 2 and 3 were each manufactured as Examples 1 to 4 and Comparative Example 1 varying in composition and film thickness. In Examples 1 to 4 and Comparative Example 1 as such, a voltage of about −2 V to +2 V was applied, and a change of resistance value at the respective levels of voltage was measured. FIGS. 6A to 6C, and FIGS. 7A and 7B are each a diagram showing the current-voltage characteristics, and the resistance-voltage characteristics. Note that FIGS. 7A and 7B do not show the resistance-voltage characteristics. In Examples 1 to 4 and Comparative Example 1 below, the ion source layers 21 and 61, and the resistance change layers 22 and 62 each have the composition used at the time of manufacturing. As for the actual composition of the ion source layers 21 and 61, and that of the resistance change layers 22 and 62, by the heat treatment performed during the manufacturing process, movable ions such as Cu, Zr, or Al are diffused in the resistance layers 22 and 62 from the ion source layers 21 and 61, respectively. FIG. 5 shows the composition of each layer in Example 1 as an example after the heat treatment. Herein, although the plasma oxidation to TiN was so performed as not to cause a reaction of the electrode materials of Ti and Te, in actuality, only low-resistance ZrOx or TiOx is formed and the characteristics are not affected.

In Examples 1 to 4 and Comparative Example 1, the composition and film thickness of the "lower electrode/oxide layer/resistance change layer/ion source layer/upper electrode" are as below.

Example 1

TiN/TiOx/Te (3.5 nm)/Cu18Zr19Te51Ge 12 atomic % (45 nm)/W

Example 2

TiN/TiOx/Te (3.5 nm)/Cu20Te30Ge7Al 43 atomic % (45 nm)/W

Example 3

TiN/-/Te (2 nm)/Cu3.5Zr3.5Ge8Te35Al 50 atomic % (45 nm)/W

Example 4

TiN/TiOx/Te (3.5 nm)/Cu2Zr2Te37Ge8Al 51 atomic % (45 nm)/W

Comparative Example 1

TiN/TiOx/Te (3.5 nm)/Cu3.5Zr3.5Ge8Te35Al 50 atomic % (45 nm)/W

Figure 7B:
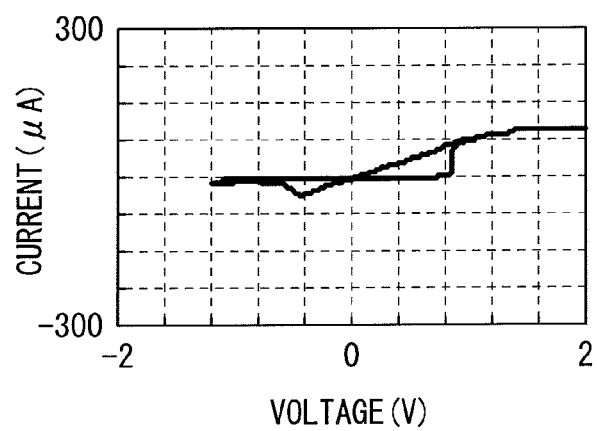

In FIGS. 6A to 6C, and FIG. 7A, compared with FIG. 7B showing the current-voltage characteristics of a memory element of related art, a resistance change is gentle with no threshold voltage. That is, with the ion source layers 21 and 61 increased in resistance value compared with the resistance change layers 22 and 62, the resulting memory elements 1 and 2 are increased in controllability over the resistance value by applied voltage. In Comparative Example 1 (FIG. 7B), the abrupt increase of current (decrease of resistance) and the abrupt decrease of current (increase of resistance) are observed with the voltage of about +1 V and −1 V similarly to the example of related art. This seems due to the increase of resistance, i.e., the increase of resistance value of the resistance change layer 22, as a result of the thickness increase of the film of Te compared with Example 3. This is also known from Example 4, showing a gentle resistance change similarly to other Examples. In Example 4, the ratio between low-resistance Cu and Zr is decreased in the ion source layer 21 with respect to Comparative Example 1 (decrease from 7% to 4% in total). In consideration thereof, for improving the controllability over resistance change by applied voltage, an important factor is not the material of the ion source layers 21 and 61 but the resistance ratio between the ion source layers 21 and 61 and the resistance change layers 22 and 62.

Figure 8:
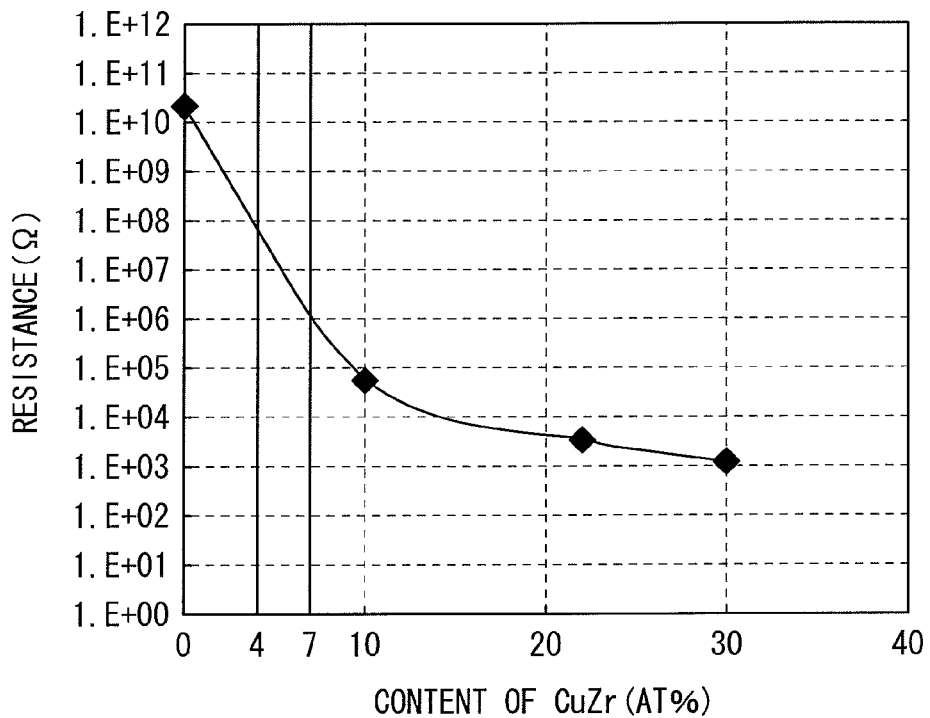
FIG. 8 is a characteristics diagram showing the relationship between the content of CuZr and a resistance value.

FIG. 8 shows a resistance change observed in the ion source layers 21 and 61 when the content (atomic %) of CU and Zr therein is changed. The ion source layers 21 and 61 are those used in Examples 1 to 4 above, i.e., those including Cu, Zr, Te, Ge, and Al. As is known from FIG. 8, when the content of CuZr is decreased, the ion source layers 21 and 61 each show an increase of resistance value. In combination with the composition in Example 4 and that in Comparative Example 1, FIG. 8 tells that, by increasing the resistance value of the ion source layers 21 and 61, i.e., by increasing a resistance value difference between the resistance change layers 22 and 62 and the ion source layers 21 and 61, the controllability over resistance change by applied voltage is improved.

As such, it is known that, by increasing the resistance value of the ion source layers 21 and 61 more than that of the resistance change layers 22 and 62, the controllability over resistance change by applied voltage is increased. Herein, as for the optimal configuration, the ion source layers 21 and 61 may be each specifically made of a transition metal such as Zr. This is considered desirable because the chalcogenide film in each of the ion source layers is stabilized thereby. Herein, although Al functions also as movable ions, because the melting point thereof becomes higher than Te with the formation of $Al_4Te_6$, Al may be used also as a structure. Moreover, in the embodiment above and others, Te is used as a chalcogenide material for forming anions, but alternatively, S or Se may be also used. If this is the case, however, a preferable chalcogenide material is the one that is more resistant to move than cations in the ion source layers 21 and 61.

Furthermore, as for the controllability over resistance change by applied voltage in the resistance change layers 22 and 62, as described above, an important factor is control over reaction control and diffusion control. Basically, the rate of reaction shows an increase exponentially in response to application of a high level of voltage, but the rate of diffusion shows an increase not exponentially but more like linearly. As such, for improving the controllability, a voltage for use is preferably as low as possible, and a slow operation is desirable.

While the present disclosure has been described in detail, the foregoing description is in all aspects illustrative and not restrictive. It is understood that numerous other modifications and variations may be devised.

For example, in the embodiment and the modification described above, the structures of the memory elements 1 and 2, and that of the memory cell array are specifically described.

However, all of the layers are not necessarily provided, or any other layers may be also provided.

Furthermore, for example, the materials of the layers, the film-forming methods and conditions, and others described in the embodiment and the modification above are surely not restrictive, and any other materials, or any other film-forming methods will also do. For example, the ion source layers 21 and 61 may be each added with any other transition metallic elements, e.g., Ti, Hf, V, Nb, Ta, Cr, Mo, or W as long as the composition ratio described above remains intact. Moreover, other than Cu, Ag, and zinc (Zn), nickel (Ni) or others may be also added.

The present disclosure contains subject matter related to that disclosed in Japanese Priority Patent Application JP 2010-155046 filed in the Japan Patent Office on Jul. 7, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising a first electrode, a memory layer, and a second electrode in this order, wherein the memory layer includes:
   a resistance change layer provided on the first electrode side thereof; and an ion source layer provided on the second electrode side thereof,
   wherein,
      a resistance value of the resistance change layer is configured to change in response to a composition change by means of a voltage applied to the first and second electrodes,
      a resistance value of the ion source layer is higher than the resistance value of the resistance change layer, and
      the ion source layer comprises (a) at least one of metallic elements of copper (Cu), aluminum (Al), germanium (Ge), and zinc (Zn), (b) at least one of zirconium (Zr), titanium (Ti), and tungsten (W), and (c) at least one of oxygen (O), tellurium (Te), sulfur (S), and selenium (Se).

2. The memory element according to claim 1, wherein the memory layer includes an oxide layer between the resistance change layer and the first electrode.

3. The memory element according to claim 1, wherein the resistance change layer contains tellurium (Te).

4. The memory element according to claim 1, wherein the change of resistance value occurs by formation of, in the resistance change layer, a low-resistance section containing a metallic element by the applied voltage to the first and second electrodes.

5. A memory device, comprising:
   a plurality of memory elements each including a first electrode, a memory layer, and a second electrode in this order; and
   pulse application unit applying a voltage or current pulse selectively to the memory elements,
   wherein, for each memory element, (1) the memory layer includes (a) a resistance change layer provided on the first electrode side thereof, and (b) an ion source layer provided on the second electrode side thereof and comprising: (i) at least one of metallic elements of copper (Cu), aluminum (Al), germanium (Ge), and zinc (Zn), (ii) at least one of zirconium (Zr), titanium (Ti), and tungsten (W), and (iii) at least one of oxygen (O), tellurium (Te), sulfur (S), and selenium (Se), (2) a resistance value of the resistance change layer is configured to change in response to a composition change by a voltage applied to the first and second electrodes, and (3) a resistance value of the ion source layer is higher than the resistance value of the resistance change layer.

6. The memory device according to claim 5, wherein the memory layer includes an oxide layer between the resistance change layer and the first electrode.

7. The memory device according to claim 5, wherein the resistance change layer contains tellurium (Te).

8. The memory device according to claim 5, wherein the change of resistance value occurs by formation of, in the resistance change layer, a low-resistance section containing a metallic element by the applied voltage to the first and second electrodes.

* * * * *